United States Patent
Tanzawa et al.

(10) Patent No.: US 6,233,189 B1
(45) Date of Patent: May 15, 2001

(54) SEMICONDUCTOR MEMORY DEVICE

(75) Inventors: Toru Tanzawa, Ebina; Shigeru Atsumi, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/584,137

(22) Filed: May 31, 2000

(30) Foreign Application Priority Data

Jun. 10, 1999 (JP) .................................................. 11-164183

(51) Int. Cl.[7] ...................................................... G11C 7/02
(52) U.S. Cl. .................. 365/207; 365/185.2; 365/185.21
(58) Field of Search .................................... 365/207, 205, 365/185.2, 185.21, 185.22, 185.23

(56) References Cited

U.S. PATENT DOCUMENTS

| 5,163,021 | 11/1992 | Mehrotra et al. ..................... 365/185 |
| 5,729,492 | * 3/1998 | Campardo ........................ 365/185.21 |
| 5,781,489 | * 7/1998 | Okamoto ................................ 365/208 |
| 5,946,238 | * 8/1999 | Campardo et al. ................ 365/185.2 |
| 6,097,633 | * 8/2000 | La Placa ........................ 365/185.21 |
| 6,118,701 | * 9/2000 | Uekubo ............................. 365/185.2 |

FOREIGN PATENT DOCUMENTS

| 61-222093 | 11/1986 | (JP) . |
| 7-1301900 | 5/1995 | (JP) . |
| 10-255492 | 9/1998 | (JP) . |

OTHER PUBLICATIONS

"Fast Programmable 256K Read Only Memory with On–Chip Test Circuits," Shigeru Atsumi, et al., IEEE Journal of Solid–state Circuits, vol. sc–20, No. 1, Feb. 1985, pp. 422–427.

"A 256–kbit Flash E2PROM Using Triple–Polysilicon Technology," Fujio Masuoka, et al., IEEE Journal of Solid–state Circuits, vol. sc. 22, No. 4, Aug. 1987, pp. 548–552.

"A 3.3V 16Mb Flash Memory with Advanced Write Automation," Alan Baker et al., IEEE International Solid–state Circuits Conference, IEEE ISSCC Digest of Technical Papers, pp. 146–147, Feb. 17, 1994.

* cited by examiner

Primary Examiner—Richard Elms
Assistant Examiner—Hien Nguyen
(74) Attorney, Agent, or Firm—Banner & Witcoff, Ltd.

(57) ABSTRACT

In a semiconductor memory device enabling to lower the source voltage, bit lines (BL) of a memory cell array (11) are selected by a column gate (12) and connected to sense amplifiers (13). Each sense amplifier (13) includes an operational amplifier (OP) having a sense node (SA) as one of its input terminals and a reference node (RE) to be shared with other sense amplifiers (13) as its other input terminal, an NMOS transistor (QN01) as a current source load interposed between the sense node (SA) and a power source (VCC) for each operational amplifier (OP), an NMOS transistor (QN02) as a current source load interposed between the reference node (REF) and the power source (VCC) for each operational amplifier (OP), and a reference voltage generating circuit (21) connected to the reference node (REF) and shared with other sense amplifiers (13) to generate a reference voltage of an intermediate level between voltages of two-valued data output to the sense node SA.

18 Claims, 11 Drawing Sheets

SEMICONDUCTOR MEMORY DEVICE

BACKGROUND OF THE INVENTION

This invention relates to a semiconductor memory device, and more particularly to a sense amplifier of a nonvolatile semiconductor memory using current read-out type memory cells.

FIG. 1 shows a circuit arrangement of the read-out system of a conventional nonvolatile semiconductor memory represented by a NOR-EEPROM. In a DRAM made up of charge read-out type memory cells, a flip-flop type sense amplifier is used. In an EEPROM, however, which is made up of current read-out type memory cells, a differentially amplifying sense amplifier as shown in FIG. 1. This sense amplifier circuit is taught in IEEE Journal of Solid-State Circuits, Vol. SC-20, No. 1, pp. 422–7, February 1985.

The sense amplifier 3 is an operational amplifier OP having two input terminals, and these input terminals are connected to a sense node SA and a reference node REF, respectively.

The sense node SA is connected to a data line DL through a clamping NMOS transistor QN1. Connected to the data line DL is a bit line BL of a memory cell array 1 selected by an NMOS transistor QN3 of a column gate 2. Between the sense node SA and the power source terminal, a PMOS transistor QP1 with connected gate and drain is provided as a current source load.

Connected to the reference node REF is a PMOS transistor QP2 as a current source load similarly to the sense node SA. Also connected to the reference node REF is a dummy data line RDL through a clamping NMOS transistor QN2 like the sense node SA. Connected to the dummy data line RDL is a dummy cell RMC via an NMOS transistor QN4 of a dummy column gate. These PMOS transistor QP2, clamping NMOS transistor QN2, dummy column gate transistor QN4 and dummy cell RMC on the part of the reference node REF form a reference voltage generating circuit 4. The reference voltage generating circuit 4 is configured to generate a reference voltage in an intermediate level of output voltage corresponding to two-valued data obtained at the sense node SA.

The PMOS transistor QP1 as the current source load has a conductance much smaller than that of the clamping NMOS transistor QN1, and its gate and drain are connected for pentode operation. This is for the purpose of diminishing voltage changes of the data line DL to a very small amplitude and applying it to the sense node SA. The clamping NMOS transistor QN1 and the power source PMOS transistor QP1 make up an initial stage amplifier. The voltage amplified by the initial stage amplifier is compared and further amplified by the operational amplifier OP, and a sense output SAOUT in the CMOS level is obtained.

FIG. 2 shows a conventional sense amplifier modified from the circuit arrangement of FIG. 1. This circuit system is disclosed in IEEE Journal of Solid-State Circuits Conference Digest of Technical Papers, pp. 146–7, February 1994. In the circuit of FIG. 1, a fixed bias voltage BIAS is applied to gates of the clamping NMOS transistors QN1 and QN2. In contrast, in FIG. 2, voltages of the data line DL and the dummy data line RDL are fed back to gates of the NMOS transistors QN1 and QN2 via inverters I1 and I2, respectively. By feedback control of the conductivity of the clamping NMOS transistor QN1 in this manner, voltages corresponding to two-valued data can be applied to the sense node SA while suppressing the voltage amplitude of the data line DL.

Although miniaturization of EEPROM memory cells have progressed and source voltages have also been lowered to about 3 V, a further decrease of power source voltages to about 2 V, for example, is demanded. However, for realization of a 2 V source, problems arise in the conventional sense amplifier circuit arrangements of FIG. 1 and FIG. 2. That is, for reliably detecting whether a current is pulled into a memory cell or not, at least 1 V, approximately, is required as the charge level of the bit line BL. Further, in the sense amplifier circuit shown in FIG. 1 and FIG. 2, the PMOS transistor QP1 as the current source load and the clamping NMOS transistor QN1 enter in series between the power source terminal and the data line DL. Expressing the threshold voltage of the PMOS transistor QP1 as Vthp, if |Vthp|= 0.8 V, approximately, the PMOS transistor QP1 needs at least 0.8V, i.e. 1 V, for example, as its source-drain voltage in order to function as a current source. Additionally, in order to operate the clamping NMOS transistor QN1 in the pentode operation region, 0.2 through 0.3V is required as its drain-source voltage. Therefore, if the power source voltage is reduced to 2 V, the necessary bit line charge level of 1 V is not obtained.

SUMMARY OF THE INVENTION

It is therefore an object of the invention to provide a semiconductor memory device using a sense amplifier circuit which enables a decrease of the power source voltage.

According to a first aspect of the invention, there is provided a semiconductor memory device comprising:

a memory cell array in which bit lines and word lines are arranged to cross and current read-out type memory cells are arranged at crossing points thereof;

a decoding circuit for selecting a bit line and a word line of said memory cell array;

a plurality of sense amplifiers for detecting and amplifying data read out onto bit lines selected from a plurality of bit lines provided for a predetermined number of bit lines, said sense amplifiers being provided for every I/O lines of said memory cell array, said sense amplifier having a sense node as one input terminal and a reference node as the other input terminal; and a reference voltage generator circuit for providing a reference voltage having a level between voltages of two-valued data output to said sense node;

wherein said sense node of each sense amplifier is connected to corresponding I/O line and said reference node of each sense amplifiers is commonly connected to said reference voltage generator.

By removing a clamping circuit conventionally used in a sense amplifier circuit, the invention makes it possible to lower the power source voltage as compared with conventional techniques, have the current source load transistor operate in a pentode mode even when using a 2 V power source, and ensure about 1 V as the charge level of bit lines to enable normal data read operation.

According to a second aspect of the present invention, there is provided a semiconductor memory device comprising:

a memory cell array in which bit lines and word lines are arranged to cross and current read-out type memory cells are arranged at crossing points thereof;

a decoding circuit for selecting a bit line and a word line of said memory cell array;

a selection gate for selecting a plurality of bit lines of said memory cell array simultaneously; and the same number of sense amplifiers as the number of said bit lines, which individually detect and amplify data read out onto said bit lines simultaneously selected by said selection gate, each of said sense amplifiers including:
at least one stage of operational amplifier having a sense node connected to a selected bit line of said memory cell array as one of input terminals thereof and a reference node shared by said plurality of sense amplifiers as the other of said input terminals;
a first current source load interposed between said sense node and a power source terminal for each operational amplifier;
a second current source load interposed between said reference node and said power source terminal; and
a reference voltage generating circuit connected to said reference node to generate a reference voltage of a level between voltages of two-valued data output to said sense node.

Moreover, in case of using a plurality of sense amplifiers simultaneously executing data reading, these sense amplifiers share a common reference node, and first and second current source loads are provided for the sense node and the reference node in each sense amplifier. Then, in the reference node, a reference voltage generating circuit for generating a reference voltage between voltages of two-valued data output to the sense node is provided to be shared by a plurality of sense amplifiers. Thereby, reliable data reading operation is possible even when the power source voltage is lowered.

DESCRIPTION OF THE PREFERRED EMBODIMENTS

Some preferred embodiments of the invention are explained below with reference to the drawings.

Figure 3:
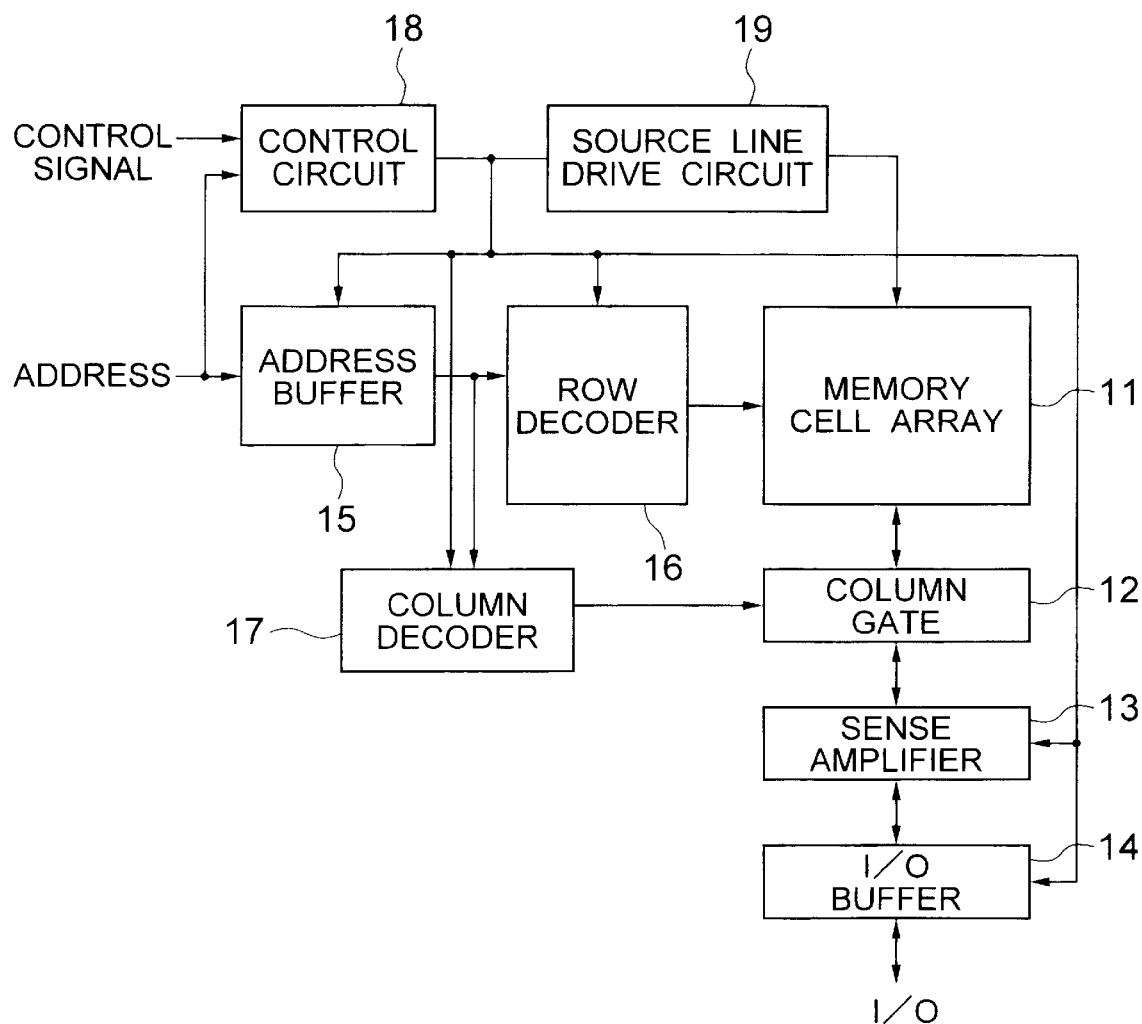
FIG. 3 is a diagram showing configuration of EEPROM according to the first embodiment of the invention.
Figure 4:
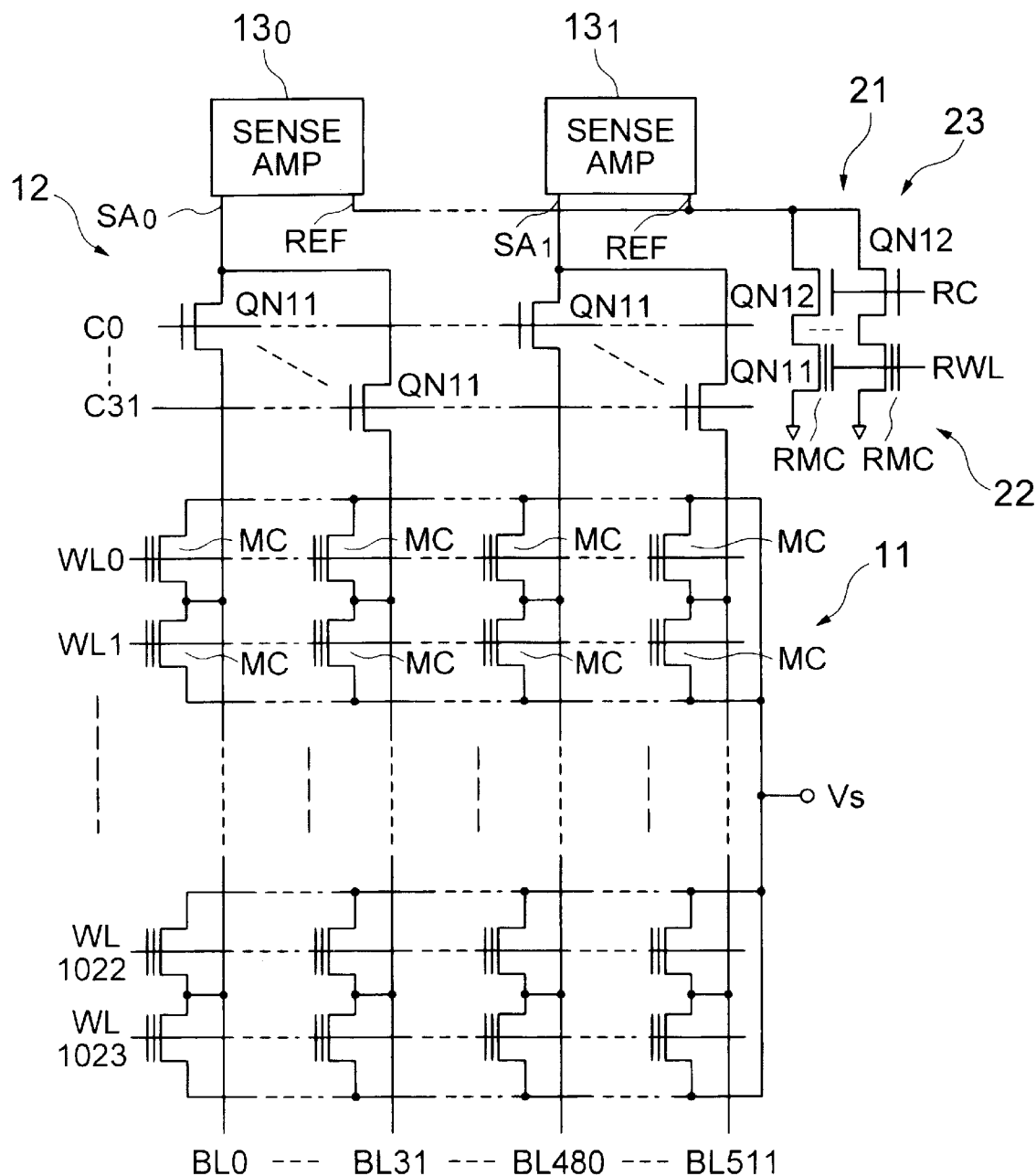
FIG. 4 is a diagram showing configuration of a memory cell array in the first embodiment.

FIG. 3 shows configuration of NOR type EPROM according to the first embodiment of the invention, and FIG. 4 shows concrete configuration of its memory cell array and data read-out path. The memory cell array 11 is an arrangement of memory cells MC of a MOS transistor structure having floating gates and control gates, as shown in FIG. 4. Control gates of the memory cells MC are driven by word lines WL, drains are connected to bit lines BL, and sources are connected to a common source line VS.

In each memory cell MC, for example, data "0" is stored when the threshold voltage is high due to injection of electrons into the floating gate, and data "1" is stored when the threshold voltage is low because of releasing electrons from the floating gate. That is, when the word line WL is driven by a read-out voltage of 5 V, for example, since memory cells with "1" data turn On and draw the current from the bit lines BL whereas memory cells with "0" data remain OFF and do not draw the current, the stored data are discriminated. Since the method of writing and erasing data is well known, it is not explained here.

It is a row decoder 16 that manages selection of a word line of the memory cell array 11, and it is a column decoder 17 and a column gate 12 controlled thereby that manage selection of a bit line. In the data read-out mode, an external address is input to an address buffer 15, and a row address and a column address of an internal address are supplied to the row decoder 16 and the column decoder 17, respectively.

In receipt of an external control signal, the control circuit 18 generates various control signals corresponding to operation modes. The source line drive circuit 19 is responsive to a control signal from the control circuit 18 to control the potential of the common source line VS of the memory cell array 11 in accordance with an operation mode. More specifically, during data read-out operation, the common source line VS is set in the ground potential VSS by the source line drive circuit 19. Bit line data read out from the memory cell array 11 is detected and amplified by the sense amplifier circuit 13, and eventually output to an I/O terminal via the data IN/OUT buffer 14.

When sixteen I/O terminals are provided, sixteen sense amplifiers 13 ($13_0$, $13_1$, ...) are provided as shown in FIG. 4, and sixteen bit lines BL are simultaneously selected in parallel from 512 bit lines BL by column gates 12. One column gate 12 is composed of 32-NMOS transistors QN11 controlled by column decode signals C0 through C31 as shown in FIG. 4. In case of this embodiment, the output nodes of the column gates 12 are directly connected to sense nodes SA (SA0, $SA_1$, ...) not through clamp circuits.

In this embodiment, each reference node REF is commonly shared by sixteen sense amplifiers 13 corresponding to sixteen bit lines BL selected simultaneously. Each sense amplifier 13 has a sense node SA and an operational amplifier OP for comparing and detecting the potential difference of the reference node REF commonly shared by all sense amplifiers 13.

For each reference node REF, a reference voltage generating circuit 21 is provided to be commonly shared by sixteen sense amplifiers 13. The reference voltage generating circuit 21 has a plurality of NMOS transistors QN1 as reference column gates 23 and a reference cell array 22 with an arrangement of reference cells RMC. More specifically, eight NMOS transistors QN12 are provided in parallel for sixteen sense amplifiers 13, and connected to each of them is a reference cell RMC which takes the same "1" data status as the memory cell MC of "1" data and has the same structure as the memory cell MC. These reference cell RMC are commonly driven by a reference word line RWL which is selected simultaneously when a certain word line WL in the memory cell array 11 is selected.

Figure 5:
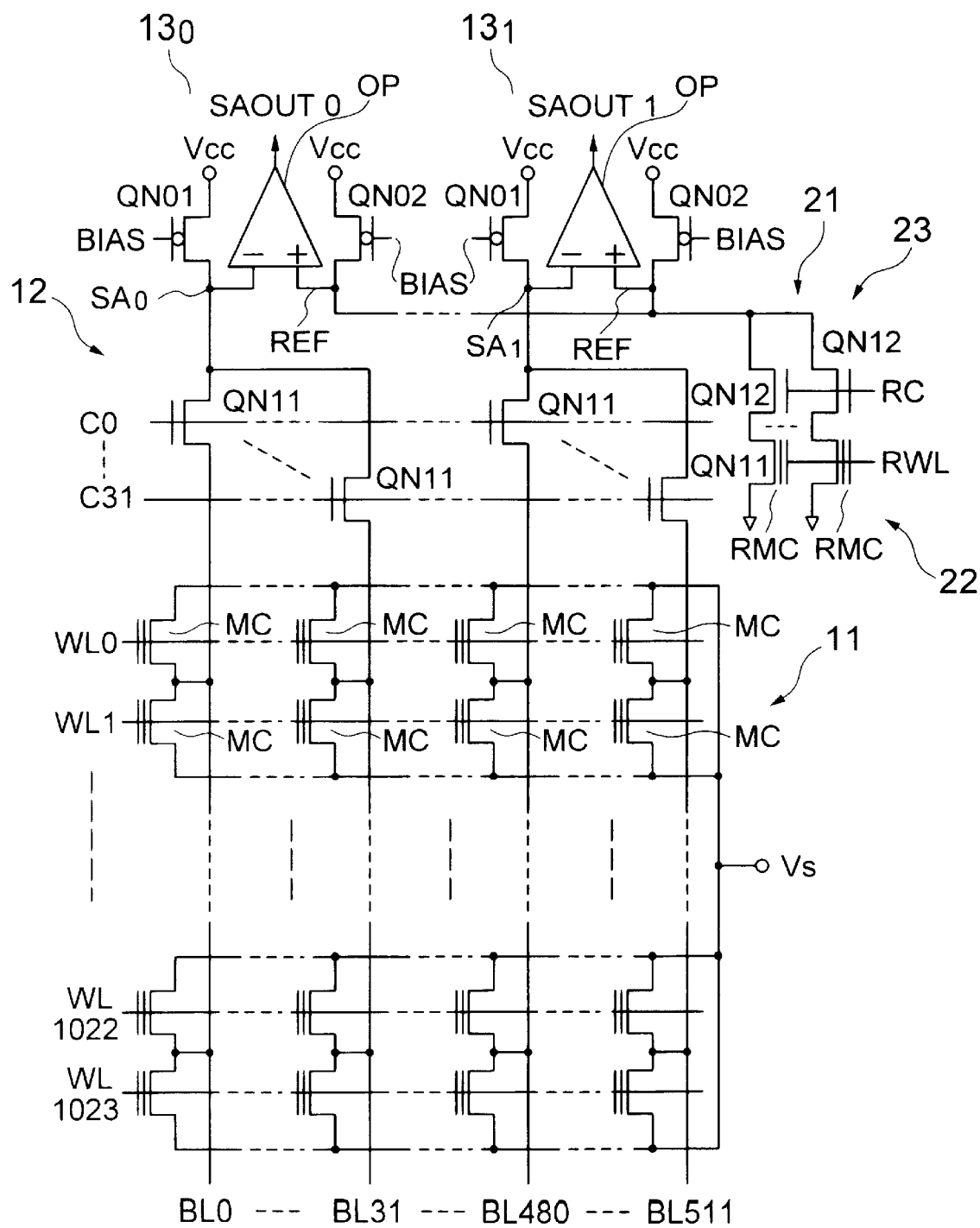
FIG. 5 is a diagram showing configuration of a sense amplifier circuit portion in the configuration of FIG. 4 in greater detail.

FIG. 5 shows configuration of the portion of the sense amplifiers in the circuit of FIG. 4 in greater detail.

In this example, each sense node SA is connected to the power source VCC via an NMOS transistor QN01 as a current source load. The NMOS transistor QN01 preferably has a threshold value of about 0V, its source is connected to the sense node SA, the drain is connected to the power source terminal VCC, and the gate is supplied with a bias voltage BIAS lower than the power source voltage which causes the NMOS transistor QN01 to operate in a pentode mode.

Between the reference node REF and the power source terminal VCC, an NMOS transistor QN02 is provided as a current source load for each sense amplifier 13. The NMOS transistor QN02 has the same designed parameter as the NMOS transistor QN01 on the part of the sense node SA, its source is connected to the reference node REF, the drain is connected to the power source terminal, and the gate is applied with a bias voltage BIAS.

Figure 6:
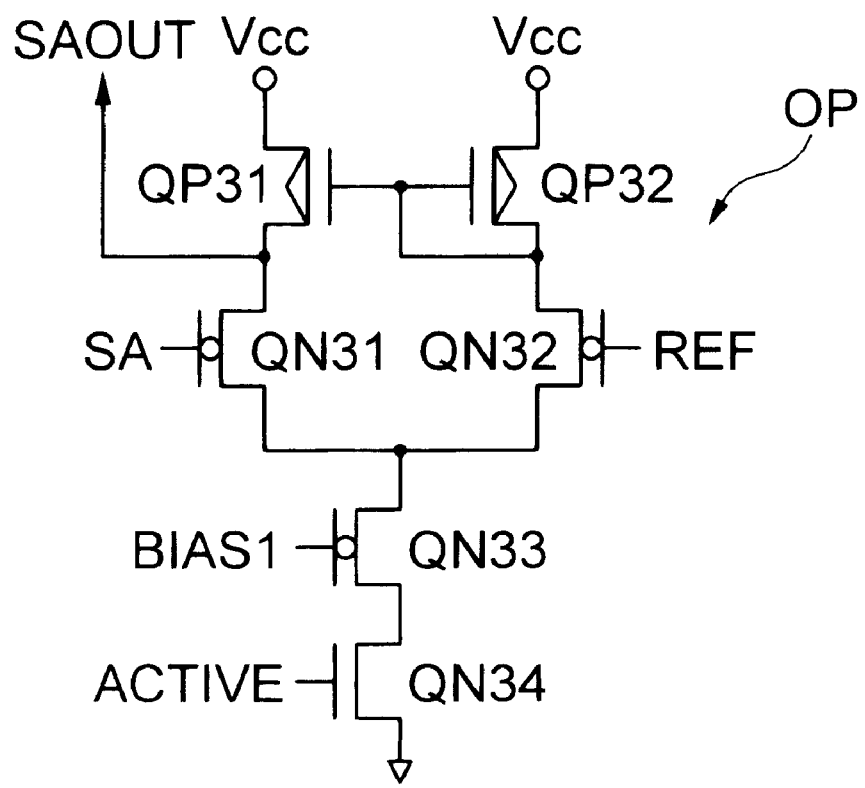
FIG. 6 is a diagram showing configuration of an operational amplifier in the first embodiment.

The operational amplifier OP is made up of PMOS transistors QP31 and QP32 making a current mirror current source, and driver NMOS transistors QN31 and QN32 connected to them as shown in FIG. 6. Gates of the driver NMOS transistors QN31, QN32 are connected to the sense node SA and the reference node REF, respectively. The driver MOS transistors QN31, QN32 used here are low-threshold transistors having threshold voltages of about 0V. Thereby, even when the power source VCC is 2V or less, a power source amplitude around 1V between the sense node SA and the reference node REF can be compared and detected.

Sources of the driver NMOS transistors QN31, QN32 are connected to the ground potential via an NMOS transistors QN33 and QN34 which are commonly connected in series. The NMOS transistor QN33 has a threshold voltage of about 0V, and a fixed bias voltage BIAS1 is applied to its gate. To the gate of the NMOS transistor QN34, a sense amplifier activating signal ACTIVE is given. The bias voltage BIAS1 applied to the gate of the NMOS transistor QN33 is a low voltage around 1 to 1.5V when the source voltage VCC is 2V, for example.

In this embodiment, when memory cells with "1" data (by drawing a current) are selected at the sense nodes SA, a current flows into the memory cells from the load NMOS transistors QN01 via the bit lines BL in corresponding sense amplifiers 13. When memory cells with "0" data (without drawing a current), almost no current flows into the memory cells. Therefore, in bit lines through which "1" data is read out, the potential rise is small, and in bit lines through which "0" data is read out, the potential rise is large. On the part of the reference nodes REF, cell currents flow in parallel to eight reference cells RMC from sixteen load NMOS transistors QN02. Therefore, the current supplied from the load NMOS transistor QN02 at the side of the reference node REF to the reference cell array 22 is less than the current supplied from the load NMOS transistor QN01 at the side of the sense node SA to the bit line BL when data is "1", and it is approximately ½, for example. As a result, a reference voltage of a level between output voltages from the sense node SA, i.e. "0" and "1" is obtained at the reference node REF.

Explanation has been made as sixteen bit lines being selected and read-out simultaneously. More generally, when n bit lines BL are selected simultaneously, for n sense amplifiers, n current source load transistors are provided on the part of the reference node REF for each sense amplifier, and n/2 reference cells RMC are used. Therefore, the current flowing on the part of the reference cell array is limited to approximately ½ of the current flowing in the bit line through which "1" data is read out, and a reference voltage of a level between output voltages "0" and "1" from the sense node SA can be obtained. The number of reference cells need not be strictly n/2, but may be approximately n/2.

According to this embodiment, the bit line BL selected by the column gate 12 of the memory cell array 11 is directly connected to the sense node SA of the sense amplifier 13 not through the clamp circuit. Then, by setting the power source VCC in 2V, the threshold voltage of the load NMOS transistor QN01 in approximately 0V, the bias voltage BIAS in 1V, and activating the load NMOS transistor QN01 in a pentode mode, 1V can be obtained as the charge level of the bit line BL. That is, the load NMOS transistor QN01 normally functions as a current source load, a sufficient bit line charge level is obtained, and normal data read-out operation is ensured. Moreover, in case of this embodiment, even when the power source voltage VCC is lowered to about 1.5V, 1V is ensured as the bias voltage BIAS, 1V is ensured as the charge level of the bit line BL, and therefore, normal operation is ensured.

Furthermore, in this embodiment, the reference voltage generating circuit 21 at the side of the reference node REF of the sense amplifier 13 includes an individual load NMOS transistor QN02 for each sense amplifier circuit 13 (therefore, the number of load NMOS transistors QN02 is equal to the number of load NMOS transistors QN01 at the side of sense nodes SA), and includes reference cells RMC corresponding to one half the number of loads. As a result, a reference voltage of a level between voltages of the sense node SA upon "0" and "1" data can be generated, and the sense margins of "0" and "1" can be equalized.

Additionally, in the operational amplifier according to this embodiment, by using the transistors QN31, QN32 with low threshold values as a driver as shown in FIG. 6, it copes with the decrease of the power source voltage. Also as the current source connected to the common source of the driver transistor QN31, QN32, the NMOS transistor QN33 with a lower threshold value is used and driven under a low bias voltage BIAS1. As a result, the operation current of the operational amplifier is maintained substantially constant. Therefore, dependency of the operation time of the sense amplifier upon the power source voltage is small. Additionally, by selectively activating the operational amplifiers with an activation signal ACTIVE, the operation current can be minimized.

(Second Embodiment)

Figure 7:
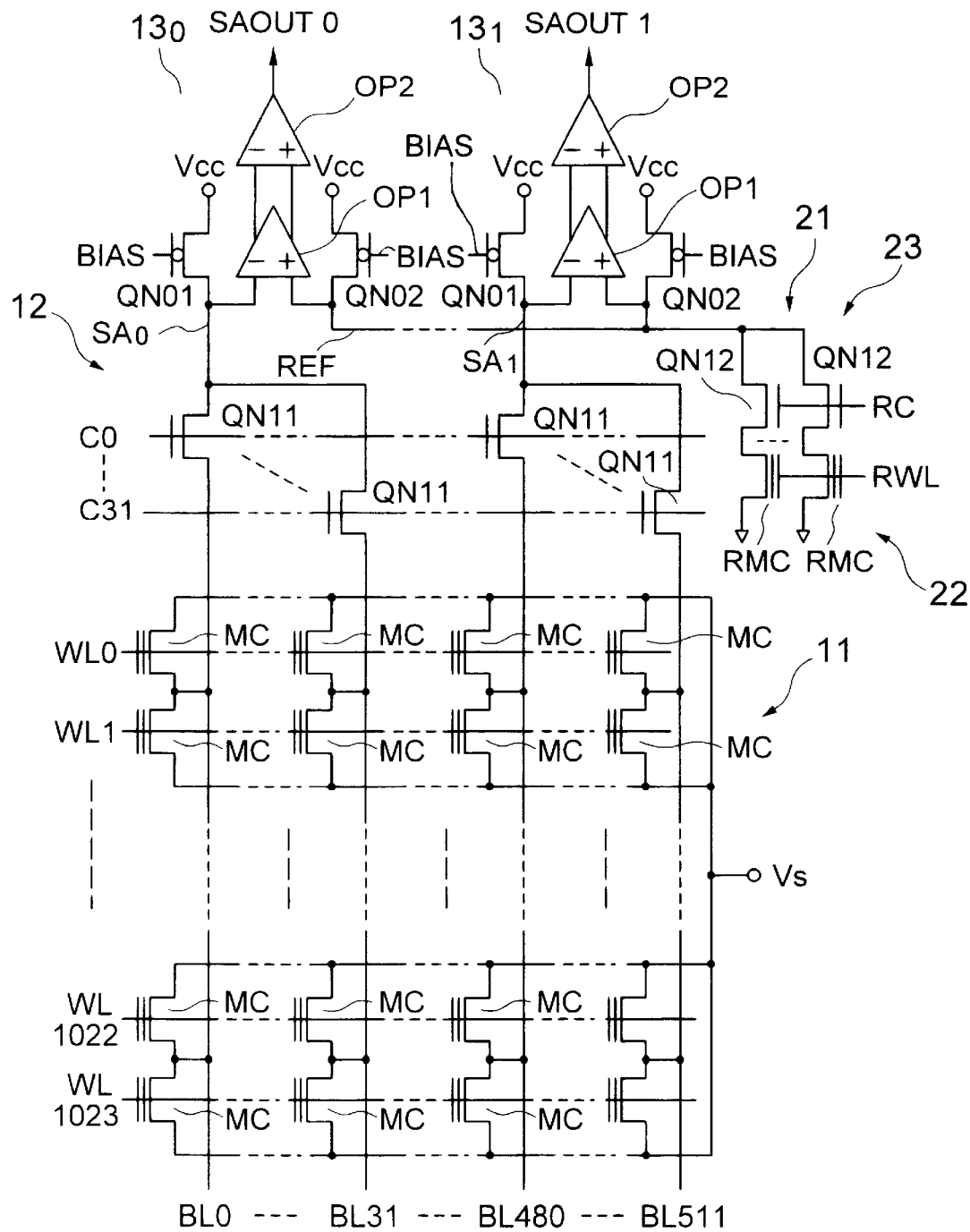
FIG. 7 is a diagram showing configuration of a sense amplifier according to the second embodiment of the invention.

FIG. 7 shows an embodiment modified from the first embodiment by using two-step operational amplifiers OP1 and OP2 for the operational amplifier OP of the sense amplifier 13. In the other respects, the second embodiment is the same as the preceding embodiment.

In conventional sense amplifiers, the portion of the clamp circuit and the current source load form an initial stage amplifier. The clamp circuit, however, is omitted in the present invention. Then, the embodiment shown here uses two-stage operational amplifiers OP1, OP2 to ensure an amplification factor equivalent to those of conventional techniques.

Figure 8:
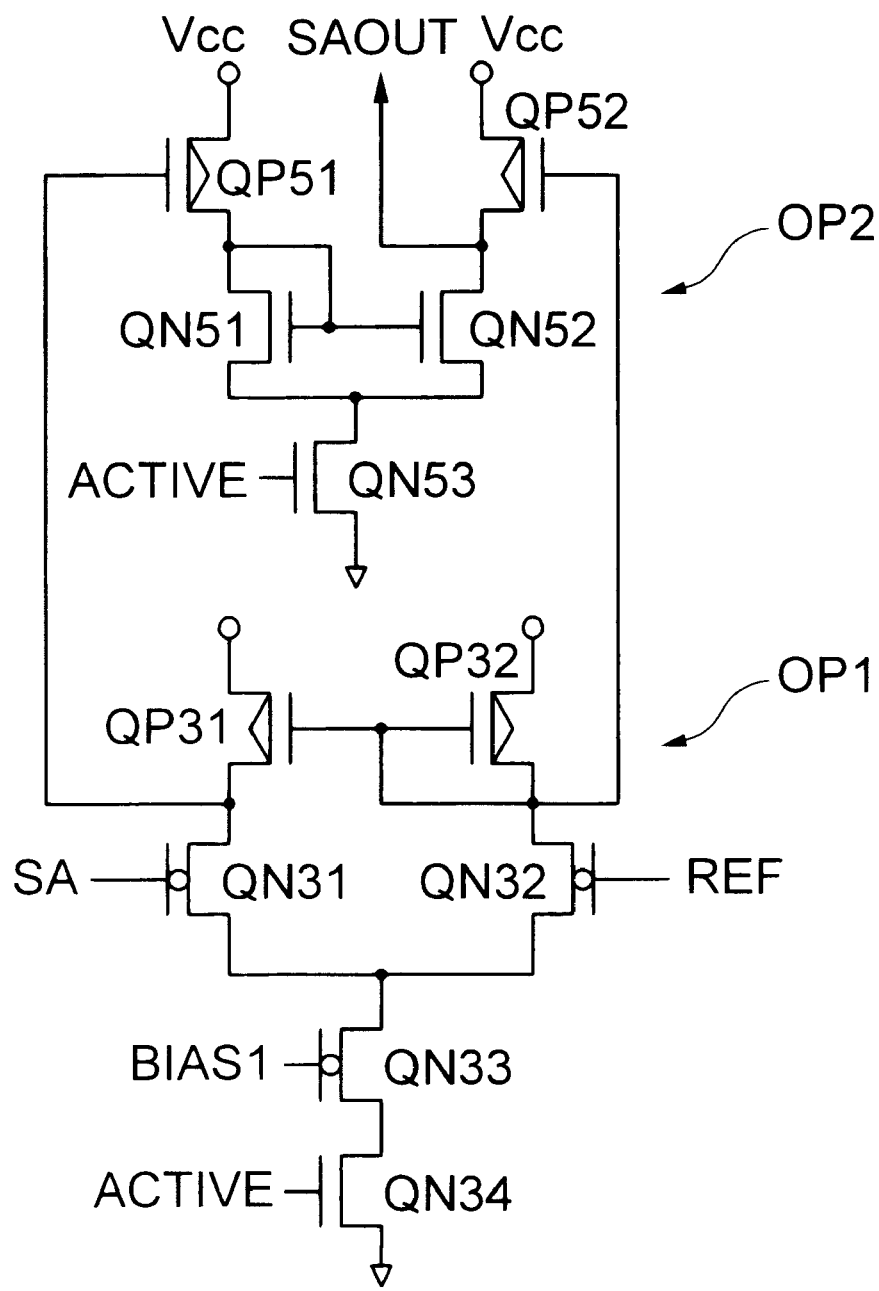
FIG. 8 is a diagram showing configuration of an operation amplifier portion in the second embodiment.

FIG. 8 shows a concrete configuration of two-stage operational amplifiers OP1, OP2 show in FIG. 7. The first-stage operational amplifier OP1 has the same configuration as that shown in FIG. 6. The second-stage operational amplifier OP2 includes driver PMOS transistors QP51, QP52 for two output nodes of the first-stage operational amplifier OP1 to enter, and NMOS transistors QN51, QN52 connected to the driver PMOS transistors QP51, QP52 and making a current mirror load. The common source of the NMOS transistors QN51, QN52 is connected to a ground potential via an activating NMOS transistor QN53.

According to this embodiment, a sense amplifier having a large amplification factor equivalent to conventional sense amplifiers without using the clamp circuit. Furthermore, similarly to the foregoing embodiment, normal data sensing operation is ensured even under a low source voltage around 2V.

Moreover, since the first-stage operational amplifier is the same as the first embodiment and dependency of the operation time of the sense amplifier upon the power source voltage is small, the operation current is minimized.

(Third Embodiment)

Figure 2:
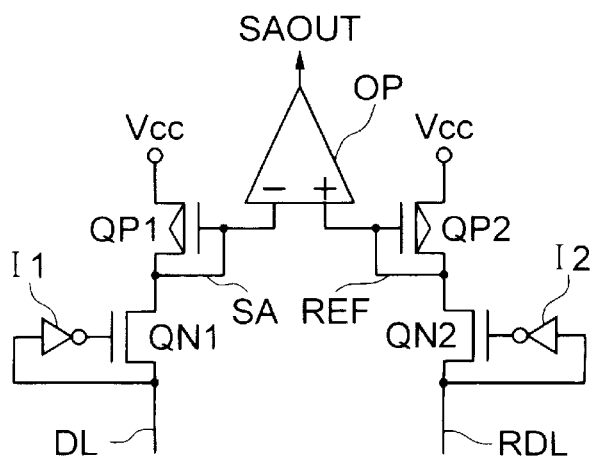
FIG. 2 is a diagram showing configuration of another conventional sense amplifier.
Figure 9:
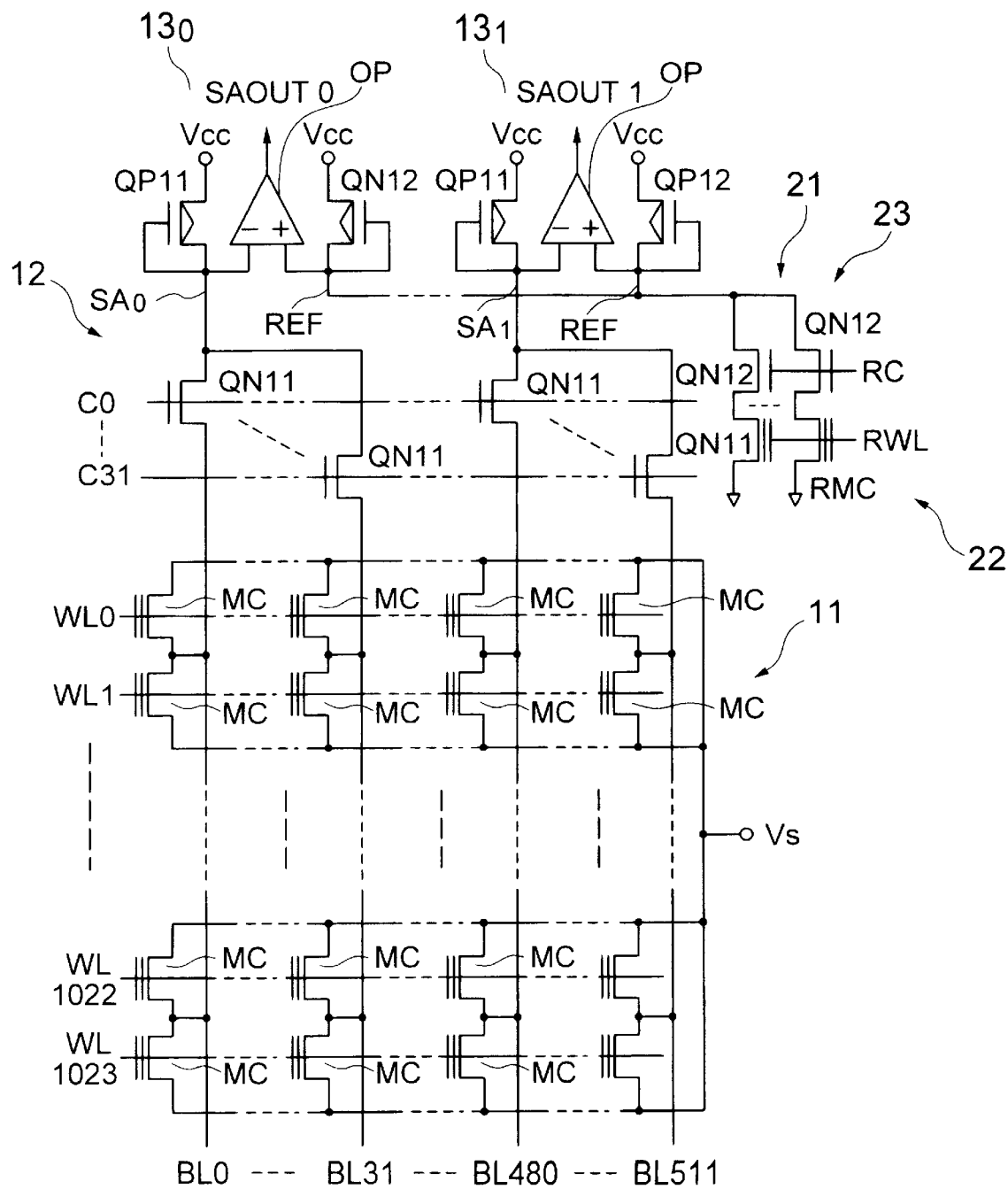
FIG. 9 is a diagram showing configuration of a sense amplifier according to the third embodiment of the invention.

FIG. 9 shows configuration of a sense amplifier 13 according to the third embodiment. A difference from the circuit of FIG. 2 according to the first embodiment lies in using PMOS transistors QP11 and QP12 as the current source loads interposed between the sense node SA of the sense amplifier 13 and the power source terminal and between the reference node and the power source terminal, respectively. The PMOS transistors QP11, QP12 are enhancement-type transistors. Sources of PMOS transistors QP61 and QP62 are connected to the power source VCC, and their drains and gates are commonly connected to the sense node SA and the reference node REF. The reference voltage generating circuit 21 has the same structure as the first embodiment. Operational amplifiers preferably have the same structure as shown in FIG. 6. In case of the sense amplifier according to this embodiment, when the threshold voltage Vthp of the load PMOS transistor QP11 is |Vthp|=1V and the power source voltage is 2V, 1V is ensured as the source-drain voltage of the load PMOS transistor QP11 and 1V is obtained as the charge level of the bit line BL. Therefore, normal data sensing operation is ensured under a lower source voltage than conventional techniques.

Additionally, when the same as shown in FIG. 6 is used as the operational amplifier OP, dependency of the operation time of the sense amplifier upon the power source voltage is small, and the operation current is minimized. In this embodiment, the operational amplifier may be configured as a two-stage structure like the second embodiment.

(Fourth Embodiment)

Figure 10:
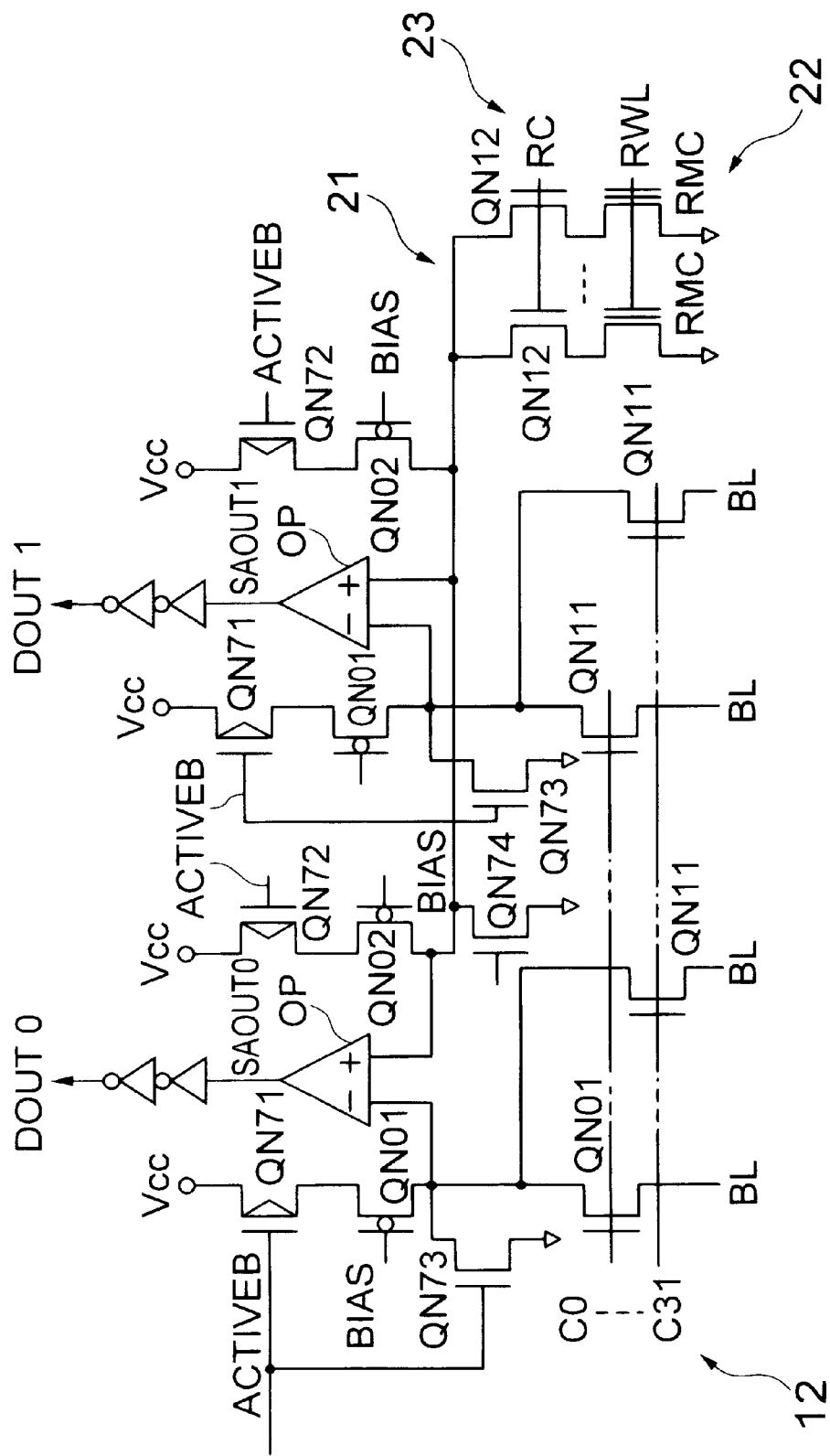
FIG. 10 is a diagram showing configuration of a sense amplifier according to the fourth embodiment of the invention.
Figure 11:
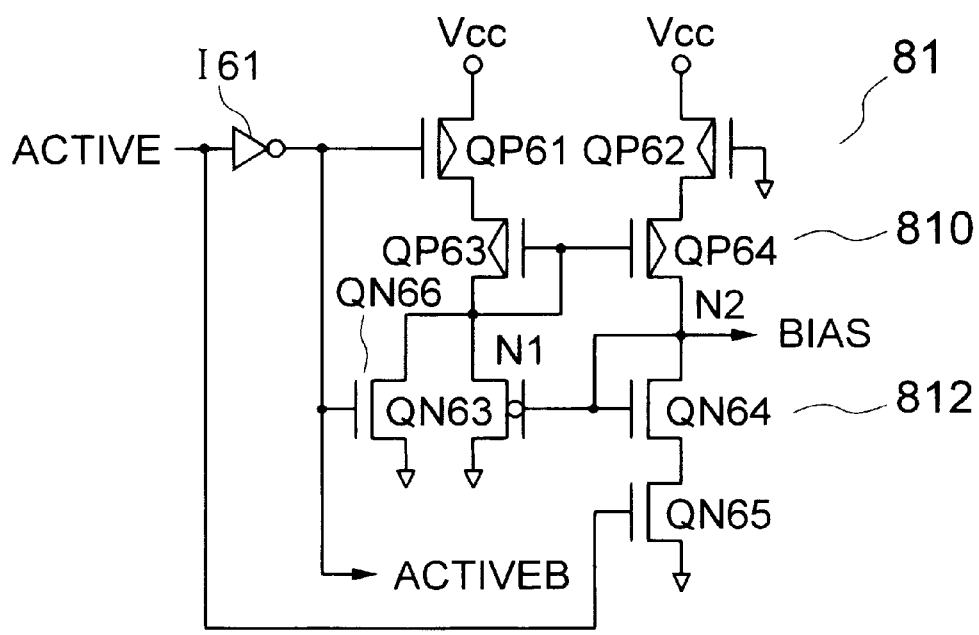
FIG. 11 is a diagram showing configuration of a bias circuit used in the fourth embodiment.

The sense amplifiers explained in any preceding embodiments are used by additionally inserting an activating power source switch nearer to the power source in its practical application. More specifically, based on the sense amplifier 13 according to the second embodiment shown in FIG. 2, an embodiment inserting a power source switch is shown in FIG. 10. FIG. 11 shows configuration of a bias circuit 81 used in this embodiment to generate a bias voltage BIAS.

As shown in FIG. 10, PMOS transistors QP71 and QP72 are inserted as power source switches between the current source load NMOS transistor QN01, QN02 and the power source VCC in each sense amplifier 13. Gates of these PMOS transistors QP71, QP72 are controlled by a signal ACTIVE inverted from the activating signal ACTIVE. Further provided for the sense node SA and the reference node REF are reset NMOS transistor QN73 and QN74, respectively. Gates of these reset NMOS transistors QN73, QN73 are also controlled the reverse signal ACTIVE of the activating signal ACTIVE.

As shown in FIG. 11, a bias circuit 81 for generating the bias voltage BIAS includes PMOS transistors QP61, QP63, NMOS transistor QN63 which are connected in series between the power source VCC and the ground connection VSS, and PMOS transistors QP62, QP64 and NMOS transistors QN64, QN64 which are also connected in series between the power source VCC and the ground connection VSS. In the pair of the PMOS transistors QP63 and QP64, sources are connected to the power source VCC via the activating PMOS transistor QP61 and the load PMOS transistor QP62, respectively, their gates are connected together and to the drain of the PMOS transistor QP63 to form a current mirror circuit 810.

Also the NMOS transistors QN63 and QN64 make a current mirror circuit 812. That is, drains of the NMOS transistors QN63, QN64 are connected to sources of the PMOS transistors QP63, QP64, respectively, their gates are connected together to the drain of the NMOS transistor QN64. The source of the NMOS transistor QN63 is connected to the ground potential VSS, and the source of the NMOS transistor QN63 is connected to the ground potential VSS through the activating NMOS transistor QN65. In parallel with the NMOS transistor QN63, a reset NMOS transistor QN66 is provided.

The PMOS transistor QP61 is driven by the signal ACTIVE inverted from the activation signal ACTIVE by an inverter I61, and the NMOS transistor QN65 is driven by the activation signal ACTIVE. The NMOS transistor QN65 connected in parallel with the NMOS transistor QN63 is driven by an output from the inverter I61.

The NMOS transistor QN63 used here has a threshold value around 0V, and the other NMOS transistors QN65, QN66 are enhancement type transistors having a positive threshold voltage Vthn. All of the PMOS transistors QP61 through QP64 are enhancement type transistors.

Here is explained the operation of the bias circuit 81 of FIG. 11 assuming the power source VCC is 2V, for example. In the period where the activation signal ACTIVE is "L", the PMOS transistor QP61 is ON, the NMOS transistor QN65 is OFF and the NMOS transistor QN66 is ON. In this status, the drain node N1 of the NMOS transistor QN63 is connected to the ground potential, the PMOS transistor QP64 turns ON, and the drain node N2 of the NMOS transistor QN64 is equalized to the source voltage VCC. This is the reset status in which the bias voltage BIAS=VCC, When the activation signal ACTIVE becomes "H", the PMOS transistor QP61 turns ON, the NMOS transistor QN65 turns ON, the NMOS transistor QN66 turns OFF, and the bias circuit 81 becomes active. That is, the same current is permitted to flow in two current paths of the NMOS transistors QN64 and QN64 by the PMOS transistors QP63 and QP63, and the bias voltage BIAS drops. At that time, if the threshold voltage of the NMOS transistor QN64 is 1V, the bias voltage BIAS is approximately 1V. If the threshold voltage of the NMOS transistor QN63 is equal to that of the NMOS transistor QN64, it may occur that the potential at the node N1 rises to the same level as the node N2, and the current supplied from the PMOS transistors QP63 and QP64 is not obtained sufficiently. In this embodiment, however, since the NMOS transistor QN63 has a threshold voltage of approximately 0V, it is controlled by the node N2 to maintain a sufficiently ON status, the node N1 is held in a positive voltage lower than the voltage of the node N2, and the bias circuit is stabilized.

Figure 1:
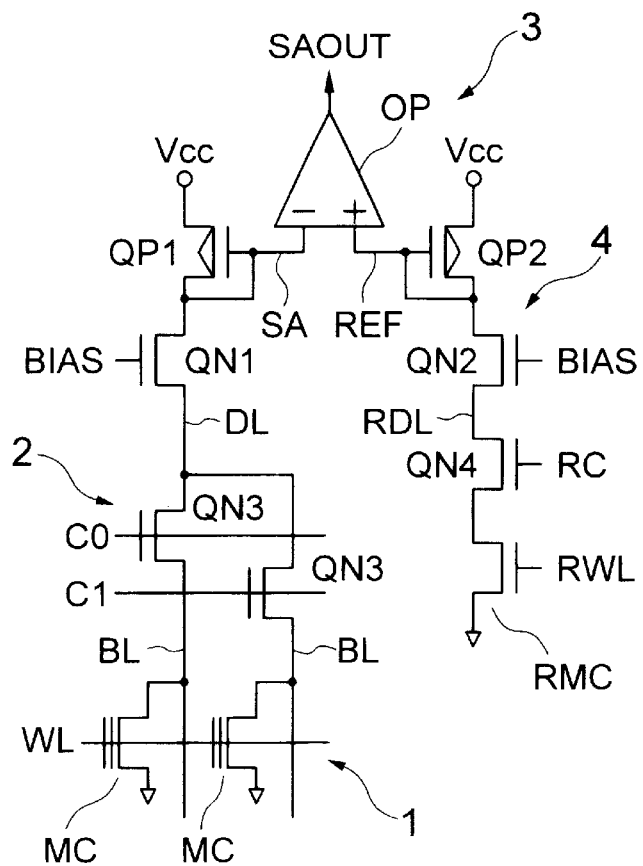
FIG. 1 is a diagram showing configuration of a conventional sense amplifier.
Figure 12:
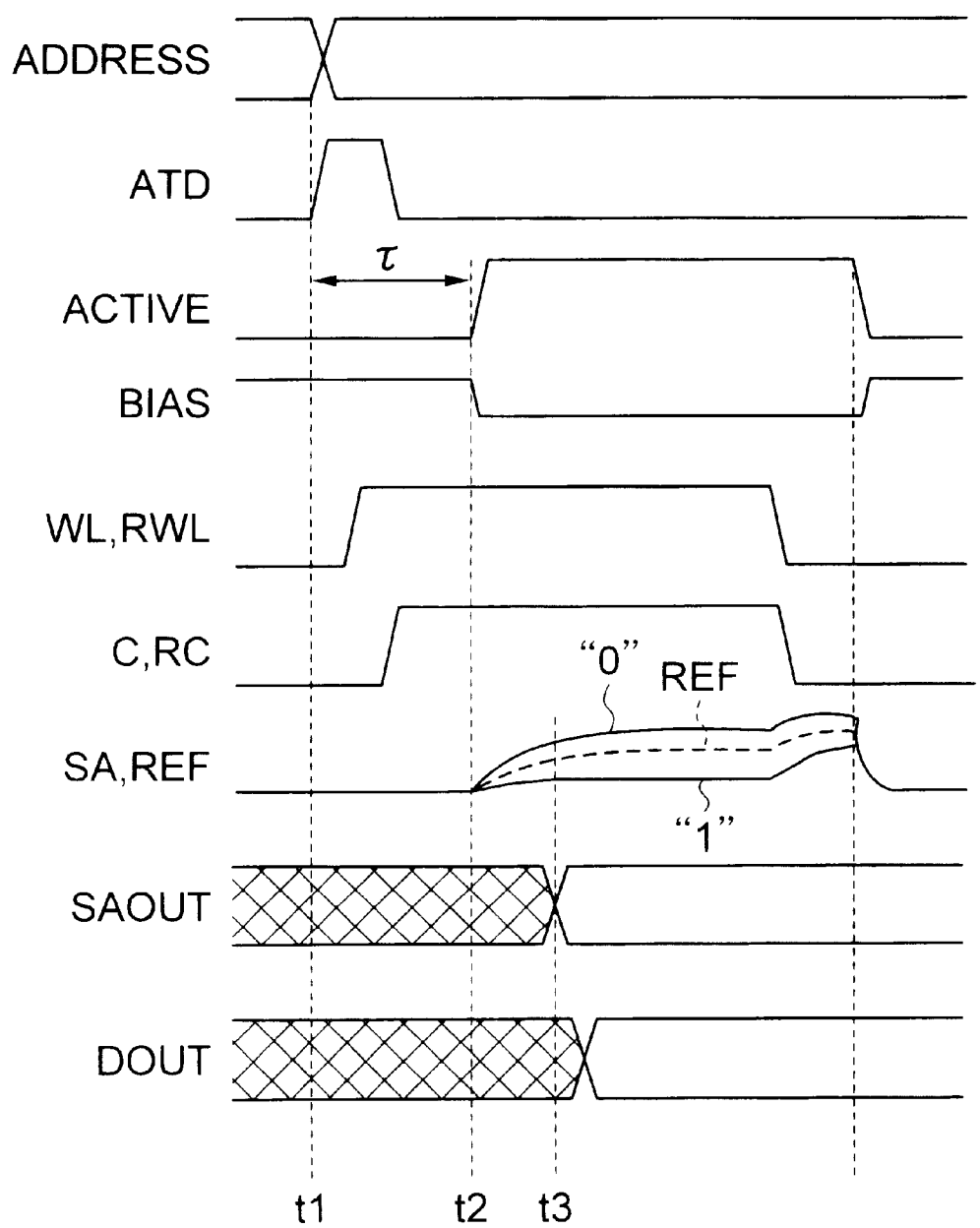
FIG. 12 is a timing chart for explaining data reading operation by the sense amplifier according to the fourth embodiment.

FIG. 12 is a timing chart of data read-out operation in case of using the sense amplifier according to this embodiment. When the address changes from one to another (time t1), an address transit detecting circuit contained in the control circuit 18 of FIG. 1 detects it, and issues an address transit detection output ATD. In receipt of this output ATD, the word line WL and the reference word line RWL are activated, and a column gate 12 and a reference column gate 23 selected by a column decode output C and a reference column signal RC turn ON. As a result, the selected bit line BL is connected to the sense node SA, and the reference cell RMC is connected to the reference node REF. After that, the activation signal ACTIVATE is generated (time t2) with a delay of a certain time, τ, for example, after issuance of the address transit output ATD, and the power source switch transistors QP11 and QP12 turn ON. In the inactivated period of ACTIVATE="L", the PMOS transistors QP71, QP72 are OFF, NMOS transistors QN71, QN72 are ON, and the sense node SA and the reference node REF are reset and held in the ground level VSS.

Due to the issuance of the activation signal ACTIVATE, the bias voltage BIAS becomes the regulated voltage of approximately 1V. Through the load NMOS transistors QN01, QN02 driven by the bias voltage BIAS, the bit line BL is charged in accordance with the data "1" or "0" of a selected memory cell. At the sense node SA of data "1", almost no rise of the potential occurs upon drawing a current, but when the data is "0", the potential largely rises because no current is drawn. The reference node REF exhibits a voltage change of approximately ½ of the voltage change of the sense node SA during "1" data as explained before. During "0" data, when the voltage difference between the sense node SA and the reference node REF reaches a certain level (time t3), the sense amplifier 13 issues a sense output SAOUT="H". A little later from the sense amplifier output SAOUT, data output DOUT is obtained at the I/O terminal.

According to this embodiment, by using NMOS transistors having the threshold value of 0V as current source loads of the sense amplifier, the source voltage can be more lowered to below 2V. Further, by providing power source switches between the current source loads and the power source and maintaining the sense amplifier inactive except the duration of the sensing operation, useless power consumption can be prevented.

Also in the embodiments shown in FIGS. 7 and 9, power source switches can be provided between the current source loads and the power source terminal.

This invention is not limited to the embodiments explained above. For example, although the embodiments have been explained as being applied to NOR type EEPROM, the invention is similarly applicable to NAND type and DINOR type EEPROM as well.

Further, the invention is also applicable to other memory cells of a type executing data read-out operation relying on whether a current is drawn or not, such as EPROM, PROM and mask ROM, for example, which are nonvolatile semiconductor memory devices not rewriting data electrically.

As described above, according to the invention, constructing a sense amplifier of a semiconductor memory device having current drawing type memory cells by using operational amplifiers, it is possible to provide a sense amplifier capable of obtaining a sufficient bit line charge level even when omitting a clamp circuit and lowering the power source voltage.

What is claimed is:

1. A semiconductor memory device comprising:
a memory cell array in which bit lines and word lines are arranged to cross and current read-out type memory cells are arranged at crossing points thereof;
a decoding circuit for selecting a bit line and a word line of said memory cell array;
a plurality of sense amplifiers for detecting and amplifying data read out onto bit lines selected from a plurality of bit lines provided for a predetermined number of bit lines, said sense amplifiers being provided for every I/O lines of said memory cell array, said sense amplifier having a sense node as one input terminal and a reference node as the other input terminal; and
a reference voltage generator circuit for providing a reference voltage having a level between voltages of two-valued data output to said sense node;
wherein said sense node of each sense amplifier is connected to corresponding I/O line and said reference node of each sense amplifier is commonly connected to said reference voltage generator.

2. The semiconductor memory device according to claim 1, wherein said sense amplifier includes at least one stage of operational amplifier.

3. The semiconductor memory device according to claim 1, further comprising a current source load connected to said sense node and a power source terminal.

4. The semiconductor memory device according to claim 3, wherein said current source load is an NMOS transistor having a source connected to said sense node, a drain connected to said power source terminal, and a gate to which a first bias voltage lower than the power source voltage is applied.

5. The semiconductor memory device according to claim 3, wherein said current source load is a PMOS transistor having a gate and a drain connected to said sense node, and having a source connected said power source terminal.

6. The semiconductor memory device according to claim 3, wherein said reference voltage generator circuit is made by using at least one reference cell so designed that a current less than a bit line current flowing through said current source load flows therein when a selected memory cell exhibits one of two-valued data.

7. The semiconductor memory device according to claim 2, wherein said operational amplifier includes a pair of differential NMOS transistors whose respective gates are signal input terminals, a current source NMOS transistor connected to a common source of said pair of differential NMOS transistors and having a gate applied with a second bias voltage, and loads interposed between drains of said pair of differential NMOS transistors and a power source.

8. The semiconductor memory device according to claim 3, wherein power source switches are provided between said current source loads and a power source terminal.

9. The semiconductor memory device according to claim 1, wherein said reference voltage generator circuit is comprised of m-reference cells each having the same structure as that of the memory cell, the number m being equal to or less than a number n which indicates the number of memory cells simultaneously read out by said plurality of sense amplifiers.

10. The semiconductor memory device according to claim 9, wherein the number m is approximately n/2.

11. A semiconductor memory device comprising:
a memory cell array in which bit lines and word lines are arranged to cross and current read-out type memory cells are arranged at crossing points thereof;
a decoding circuit for selecting a bit line and a word line of said memory cell array;
a selection gate for selecting a plurality of bit lines of said memory cell array simultaneously; and
the same number of sense amplifiers as the number of said bit lines, which individually detect and amplify data read out onto said bit lines simultaneously selected by said selection gate, each of said sense amplifiers including:
at least one stage of operational amplifier having a sense node connected to a selected bit line of said memory cell array as one of input terminals thereof and a reference node shared by said plurality of sense amplifiers as the other of said input terminals;

a first current source load interposed between said sense node and a power source terminal for each operational amplifier;

a second current source load interposed between said reference node and said power source terminal; and a reference voltage generating circuit connected to said reference node to generate a reference voltage of a level between voltages of two-valued data output to said sense node.

12. The semiconductor memory device according to claim 11, wherein each of said first and second current source loads is a NMOS transistor having a source connected to said sense node and said reference node, a drain connected to said power source terminal, and a gate to which a first bias voltage lower than the power source voltage is applied.

13. The semiconductor memory device according to claim 11, wherein each of said current source load is a PMOS transistor having a gate and a drain connected to said sense node and said reference node, and having a source connected said power source terminal.

14. The semiconductor memory device according to claim 11, wherein said reference voltage generating circuit is made by using at least one reference cell so designed that a current less than a bit line current flowing through said current source load flows therein via said second current source load when a selected memory cell exhibits one of two-valued data.

15. The semiconductor memory device according to claim 11, wherein power source switches are interposed between said first and second current source loads and said power source terminal, respectively.

16. The semiconductor memory device according to claim 11, wherein said reference voltage generator circuit is comprised of m-reference cells each having the same structure as that of the memory cell, the number m being equal to or less than a number n which indicates the number of memory cells simultaneously read out by said plurality of sense amplifiers.

17. The semiconductor memory device according to claim 16, wherein the number m is approximately n/2.

18. The semiconductor memory device according to claim 11 wherein, when said second current source is constructed of p number transistors having the same construction as said first current source loads and the number of memory cells simultaneously read out by said sense amplifiers is n, and p is equal to or less than n.

* * * * *